US008862647B2

(12) United States Patent
Shibayama

(10) Patent No.: US 8,862,647 B2
(45) Date of Patent: Oct. 14, 2014

(54) SEMICONDUCTOR INTEGRATED CIRCUIT AND EXPONENT CALCULATION METHOD

(75) Inventor: Atsufumi Shibayama, Tokyo (JP)

(73) Assignee: NEC Corporation, Tokyo (JP)

( * ) Notice: Subject to any disclaimer, the term of this patent is extended or adjusted under 35 U.S.C. 154(b) by 578 days.

(21) Appl. No.: 13/262,748

(22) PCT Filed: Apr. 12, 2011

(86) PCT No.: PCT/JP2011/002148
§ 371 (c)(1),
(2), (4) Date: Oct. 3, 2011

(87) PCT Pub. No.: WO2011/161859
PCT Pub. Date: Dec. 29, 2011

(65) Prior Publication Data
US 2012/0117337 A1 May 10, 2012

(30) Foreign Application Priority Data
Jun. 22, 2010 (JP) .................................. 2010-141765

(51) Int. Cl.
G06F 7/00 (2006.01)
G06F 15/00 (2006.01)
H03M 7/24 (2006.01)

(52) U.S. Cl.
CPC ....................................... H03M 7/24 (2013.01)
USPC ........................................... 708/200; 708/205

(58) Field of Classification Search
CPC ........................................................ H03M 7/24
USPC ........................................................ 708/200
See application file for complete search history.

(56) References Cited

U.S. PATENT DOCUMENTS 5,931,895 A * 8/1999 Yamada et al. ................ 708/500
7,917,567 B1 * 3/2011 Mason et al. .................. 708/495
(Continued)

FOREIGN PATENT DOCUMENTS

JP 06-075746 3/1994
JP 08-212052 8/1996
(Continued)

OTHER PUBLICATIONS

Anatoly I. Grushin, Maxim L. Remizov, Fast Result Normalization in FP Adder, IEEEI 2008, pp. 152-156.*
(Continued)

*Primary Examiner* — Chat Do
*Assistant Examiner* — Kevin G Hughes
(74) *Attorney, Agent, or Firm* — Young & Thompson

(57) ABSTRACT

Provided is a semiconductor integrated circuit and an exponent calculation method that, when normalizing a plurality of data by a common exponent, speed up exponent calculation and reduce circuit scale and power consumption. When normalizing a plurality of data by a common exponent, a semiconductor integrated circuit calculates the exponent of the plurality of data. Included is a bit string generator that generates a second bit string containing bits having a transition value indicating that values of adjacent bits are different or a non-transition value indicating that values of adjacent bits are not different for each pair of adjacent bits of a first bit string constituting the data, and an exponent calculator that calculates the exponent of the plurality of data based on bit position of the transition value of a plurality of second bit strings generated from a plurality of first bit strings respectively constituting the plurality of data.

11 Claims, 11 Drawing Sheets

(56) References Cited

U.S. PATENT DOCUMENTS

| | | | |
|---|---|---|---|
| 2003/0161278 A1* | 8/2003 | Igura | 370/320 |
| 2012/0117337 A1* | 5/2012 | Shibayama | 711/154 |
| 2014/0089361 A1* | 3/2014 | Shibayama | 708/205 |

FOREIGN PATENT DOCUMENTS

| | | |
|---|---|---|
| JP | 09-128213 | 5/1997 |
| JP | 10-040073 | 2/1998 |
| JP | 2002-318792 | 10/2002 |

OTHER PUBLICATIONS

Elisardo Antelo, MontserratB'oo, Javier D. Bruguera, and Emilio L. Zapata, A Novel Design of a Two Operand Normalization Circuit, IEEE Transactions on Very Large Scale Integration (VLSI) Systems, vol. 6, No. 1, Mar. 1998, pp. 173-176.*

International Search Report—PCT/JP2011/002148—Jun. 21, 2011.

* cited by examiner

SEMICONDUCTOR INTEGRATED CIRCUIT AND EXPONENT CALCULATION METHOD

TECHNICAL FIELD

The present invention relates to a semiconductor integrated circuit and an exponent calculation method and, particularly, to technique of operations in digital signal processing.

BACKGROUND ART

In digital signal processing, floating point operations have an advantage that highly accurate operations are possible even when the range of the value of signal data to be handled is large but have a problem that a complicated circuit is required and therefore the circuit scale and power consumption are large. Further, fixed point operations have an advantage that a circuit is simple and the circuit scale and power consumption are small but have a problem that the accuracy of operations is low.

On the other hand, as an operation method that has advantages of both floating point and fixed point, there are block floating point operations. In the block floating point operations, a plurality of signal data are grouped into one block, and normalization is performed for the entire block to have a common exponent in each block.

Specifically, in the block floating point processing, the normalization of a block floating point is performed in the following steps.

(1) Calculate the maximum exponent of all data in the block.

(2) Shift (normalize) the entire block by the calculated maximum exponent.

The maximum exponent is the largest exponent that does not cause overflow of all data in the block. The maximum exponent is equal to the exponent value of data with the largest absolute value among all data in the block.

As a method of efficiently calculating the maximum exponent, the following method is known (see Patent Literature 1, for example).

(1) Calculate the absolute values of data in the block.

(2) Calculate the logical OR of the absolute values of the data.

(3) Detect the bit position on the MSB (Most Significant Bit) side of the calculated logical OR and determine the maximum exponent.

A specific example of the normalization of a block floating point using the above-described method of calculating the maximum exponent is described hereinbelow.

First, consider a block composed of eight data, input data 1 to input data 8, which are eight-bit input data shown below, as a block to be normalized. In the following, the value of each data is represented by two's complement. Note that, in the bit string of the data shown hereinbelow, the leftmost bit is MSB, and the rightmost bit is LSB. The MSB is a sign bit.

Input data 1: 00010111
Input data 2: 00110001
Input data 3: 00000110
Input data 4: 11110011
Input data 5: 11111000
Input data 6: 00000110
Input data 7: 00001011
Input data 8: 00011011

Next, calculate the absolute values of the data (the input data 1 to 8) in the block. The absolute values of the input data 1 to 8 are hereinafter referred to as the absolute values 1 to 8.

Specifically, the absolute value of input data k is referred to as the absolute value k (k is a positive integer of any one of 1 to 8.).

Absolute value 1: 00010111
Absolute value 2: 00110001
Absolute value 3: 00000110
Absolute value 4: 00001101
Absolute value 5: 00001000
Absolute value 6: 00000110
Absolute value 7: 00001011
Absolute value 8: 00011011

Then, calculate the logical OR of the calculated absolute values. The logical OR of the absolute values 1 to 8 is shown below.

Logical OR: 00111111

Then, detect the 5th bit as the bit position where the value of the bit first becomes 1 when viewed from the MSB (Most Significant Bit) side of the calculated logical OR. Assume that the MSB is the 7th bit, and the LSB (Least Significant Bit) is the 0th bit. In the case of bit shifting the input data 1 to 8 to the left by the same shift amount in order to normalize the input data 1 to 8 by a common exponent, if the shift amount is one bit, the normalized value is accurately represented, with any signs of the input data 1 to 8 remaining unchanged. Thus, the maximum exponent is −1.

Finally, normalize all data (the input data 1 to 8) in the group based on the calculated maximum exponent and determine the normalized data (normalized data 1 to 8). Specifically, when the maximum exponent is −1, shift the data to the left by one bit. Data after normalization of the input data 1 to 8 are referred to hereinafter as the normalized data 1 to 8. Thus, data after normalization of the input data k is referred to as the normalized data k (k is a positive integer of any one of 1 to 8.). Because the maximum exponent is −1, the actual value of the normalized data 1 to 8 is the value obtained by multiplying each data by the −1th power of 2.

Normalized data 1: 00101110
Normalized data 2: 01100010
Normalized data 3: 00001100
Normalized data 4: 11100110
Normalized data 5: 11110000
Normalized data 6: 00001100
Normalized data 7: 00010110
Normalized data 8: 00110110

In the above-described normalization process, it is necessary to calculate the absolute values of the data in the block in the step of calculating the maximum exponent. In order to convert negative data into positive data in the calculation of the absolute values, it is necessary to execute processing such as bit inversion, addition of 1, and carry when adding 1. There is thus a problem that the process of calculating the absolute values takes time. Further, because a circuit for executing such processing is needed, there is a problem that the circuit scale and power consumption are large.

Further, in the block floating point processing, it is necessary to repeatedly calculate the absolute values a plurality of times corresponding to the number of data constituting the block. Therefore, in the above-described normalization process, processing time to repeat the calculation of the absolute values which takes time increases drastically.

As described above, the above-described normalization process has a problem that the calculation of the maximum exponent cannot be done at high speed and the circuit scale and power consumption are large.

Further, the above-described normalization process has a problem that it is necessary to process the maximum value on the negative side in an exceptional manner or not to use the maximum value on the negative side. This is because, in the case of X-bit data, while the maximum value on the negative side of the data is −1× (the (X−1)th power of 2), +1× (the (X−1)th power of 2), which is the absolute value of the same data, cannot be represented by X bits (X is a positive integer). Note that x is a multiplication sign.

Specifically, in the case of 8-bit data, while the maximum value on the negative side of the data is −1× (the 7th power of 2)=−128, +1× (the 7th power of 2)=+128, which is the absolute value of the same data, cannot be represented by 8 bits, and 9 bits are necessary. Therefore, there is a problem that, when the value of data is −128, it is necessary to process −128 in an exceptional manner, such as saturating the absolute value +128 to +127, or not to use −128.

Note that Patent Literature 2 discloses the 1-position detecting method that sequentially computes the value of each bit using mask data to extract data for determining a value per bit of data indicating the position where the bit is 1 in input data. Patent Literature 2 discloses that, according to the 1-position detecting method, it is possible to shorten processing time to detect the position where the bit is 1 because mask processing and comparison need to be performed only once in order to determine a value per bit of data in the position where the bit is 1.

Further, Patent Literature 3 discloses the normalized data generation circuit that detects a bit position where a bit having a logical state different from that of the leading bit of input data appears first and then shifts the input data based on information representing the distance from the position of the decimal point of the input data to the detected bit position. Patent Literature 3 discloses that, according to the normalized data generation circuit, it is possible to shorten the time to generate normalized data because the most part of the shift operation can be performed in hardware.

However, none of Patent Literatures 2 and 3 disclose a technique to generate a bit string that contains bits indicating whether the values of adjacent bits are different or not for each pair of adjacent bits from a bit string that constitutes data to be normalized, as in the present invention.

CITATION LIST

Patent Literature

Patent Literature 1: Japanese Unexamined Patent Application Publication No. H09-128213
Patent Literature 2: Japanese Unexamined Patent Application Publication No. H06-75746
Patent Literature 3: Japanese Unexamined Patent Application Publication No. H08-212052

SUMMARY OF INVENTION

Technical Problem

As described above as Background Art, there is a problem that, when normalizing a plurality of data by a common exponent, the calculation of the exponent cannot be done at high speed and the circuit scale and power consumption are large.

The present invention has been accomplished to solve the above problems and an object of the present invention is thus to provide a semiconductor integrated circuit and an exponent calculation method that, when normalizing a plurality of data by a common exponent, enable speedup of the calculation of the exponent and reduction of the circuit scale and power consumption therefor.

Solution to Problem

A semiconductor integrated circuit according to a first exemplary aspect of the present invention is a semiconductor integrated circuit that, when normalizing a plurality of data by a common exponent, calculates the exponent of the plurality of data, which includes a bit string generator that generates a second bit string containing bits having a transition value indicating that values of adjacent bits are different or a non-transition value indicating that values of adjacent bits are not different for each pair of adjacent bits of a first bit string constituting the data, and an exponent calculator that calculates the exponent of the plurality of data based on a bit position of the transition value of a plurality of second bit strings generated from a plurality of first bit strings respectively constituting the plurality of data by the bit string generator.

An exponent calculation method according to a second exemplary aspect of the present invention is an exponent calculation method that, when normalizing a plurality of data by a common exponent, calculates the exponent of the plurality of data, which includes generating a second bit string containing bits having a transition value indicating that values of adjacent bits are different or a non-transition value indicating that values of adjacent bits are not different for each pair of adjacent bits of a first bit string constituting the data, and calculating the exponent of the plurality of data based on a bit position of the transition value of a plurality of second bit strings generated from a plurality of first bit strings respectively constituting the plurality of data.

Advantageous Effects of Invention

According to the exemplary aspects of the present invention described above, it is possible to provide a semiconductor integrated circuit and an exponent calculation method that, when normalizing a plurality of data by a common exponent, enable speedup of the calculation of the exponent and reduction of the circuit scale and power consumption therefor.

DESCRIPTION OF EMBODIMENTS

Exemplary embodiments of the present invention are described hereinafter with reference to the drawings.

First Exemplary Embodiment

Figure 1:
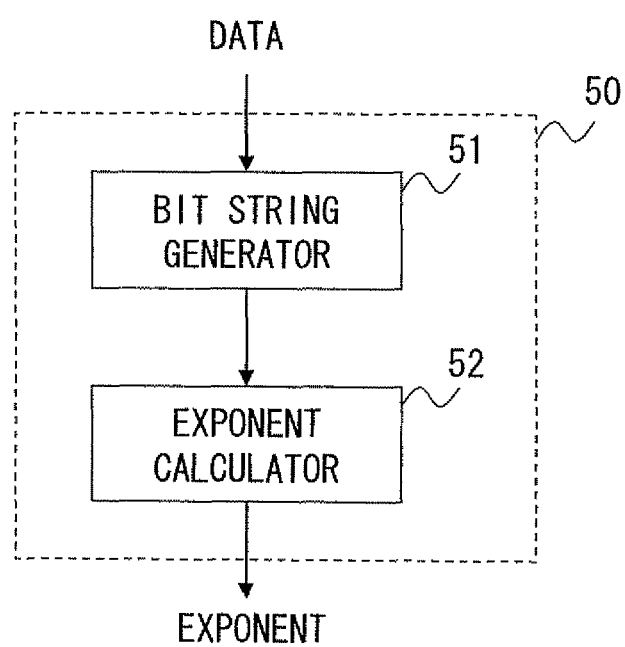
FIG. 1 is a block diagram showing a configuration of a semiconductor integrated circuit according to a first exemplary embodiment of the present invention.

Firstly, a maximum exponent 50, which is an outline of a maximum exponent calculator according to a first exemplary embodiment of the present invention, is described with reference to FIG. 1. FIG. 1 is a block diagram showing a configuration of a semiconductor integrated circuit according to the first exemplary embodiment of the present invention.

The semiconductor integrated circuit 50 includes a bit string generator 51 and an exponent calculator 52. When normalizing a plurality of data by a common exponent, the semiconductor integrated circuit 50 calculates the exponent of the plurality of data.

The bit string generator 51 generates a second bit string that contains bits having a transition value indicating that the values of adjacent bits are different or a non-transition value indicating that the values of adjacent bits are not different, for each pair of adjacent bits of a first bit string that constitutes data.

The exponent calculator 52 calculates the exponent of a plurality of data based on the bit positions of the transition values of a plurality of second bit strings which are generated from a plurality of first bit strings that respectively constitute a plurality of data by the bit string generator 51.

A plurality of data to be normalized by a common exponent are input to the bit string generator 51. The bit string generator 51 generates a second bit string that contains bits having a transition value indicating that the values of adjacent bits are different or a non-transition value indicating that the values of adjacent bits are not different, for each pair of adjacent bits of a first bit string that constitutes the data. The bit string generator 51 outputs a plurality of second bit strings which are generated from a plurality of first bit strings that respectively constitute the plurality of data to the exponent calculator 52.

The exponent calculator 52 calculates the exponent of the plurality of data based on the bit positions of the transition values of the plurality of second bit strings which are output from the bit string generator 51. The exponent calculator 52 outputs the calculated exponent.

As described above, the semiconductor integrated circuit 50 according to the first exemplary embodiment generates the second bit string that contains bits indicating whether the values of adjacent bits are different or not for each pair of adjacent bits of the first bit string that constitutes the data to be normalized. With the second bit string, it can be determined whether the values of adjacent bits are different or not for each pair of adjacent bits of the first bit string. It is thereby possible to specify the shift amount by which the normalized value is accurately represented with any signs of the data remaining unchanged. Thus, the maximum exponent can be calculated.

Because the semiconductor integrated circuit 50 according to the first exemplary embodiment simply performs a logical operation as to whether the values of adjacent bits are different or not, it is possible to speed up the calculation of the exponent and reduce the circuit scale and power consumption therefor.

The first exemplary embodiment of the present invention is described hereinafter in detail with reference to the drawing.

Figure 2:
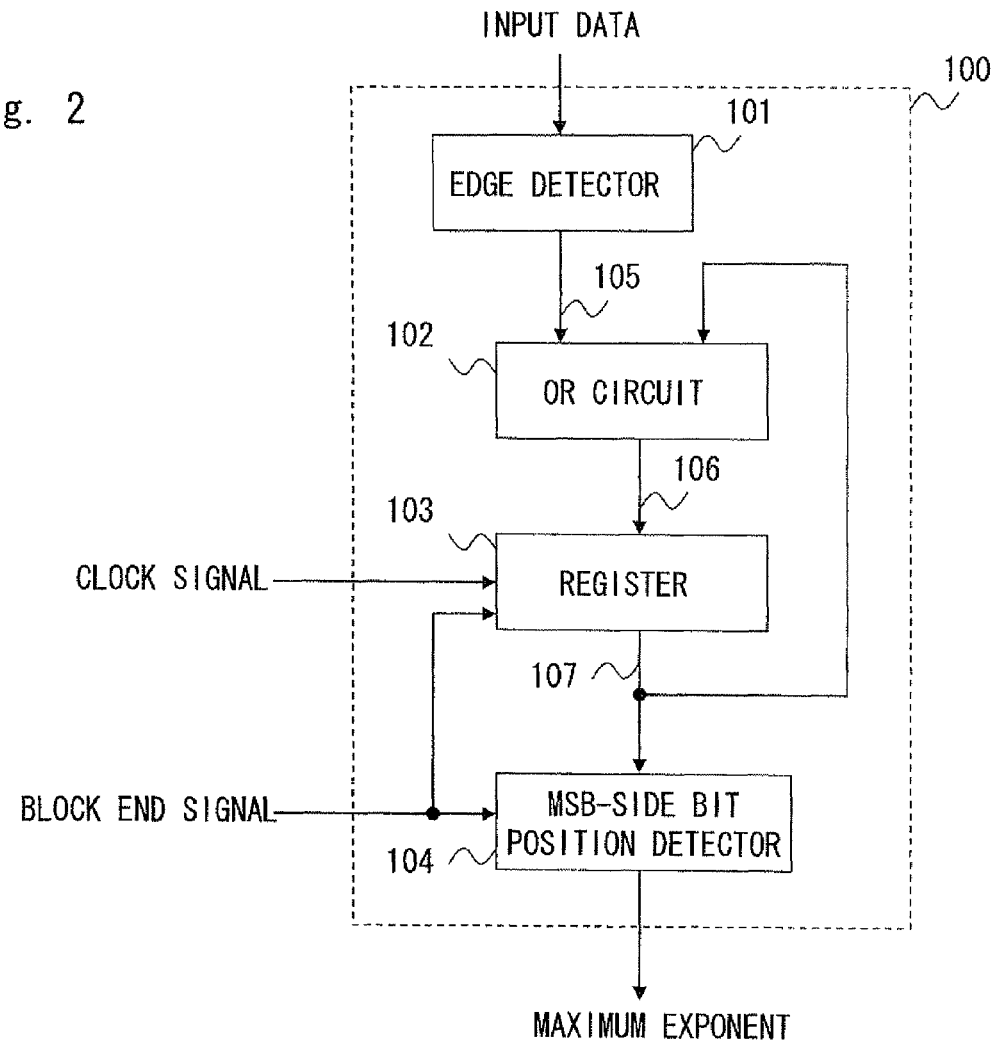
FIG. 2 is a block diagram showing a configuration of a maximum exponent calculator according to the first exemplary embodiment of the present invention.

FIG. 2 is a block diagram showing a configuration of a maximum exponent calculator 100 according to the first exemplary embodiment of the present invention. The maximum exponent calculator 100 is a circuit that calculates the maximum exponent of all data in a block which is composed of a plurality of input data.

Specifically, all data in a block are sequentially input to the maximum exponent calculator 100 based on an input clock signal, and the maximum exponent calculator 100 calculates the maximum exponent of all data in the block. The maximum exponent calculator 100 outputs the calculated maximum exponent for each block. At this time, the maximum exponent calculator 100 identifies the end of the block by referring to an input block end signal. The input data are input to the maximum exponent calculator 100 from an external circuit (not shown), for example. Further, the external circuit outputs an asserted block end signal to the maximum exponent calculator 100 in the cycle where the last input data in the block is output to the maximum exponent calculator 100.

The maximum exponent calculator 100 includes an edge detector 101, an OR circuit 102, a register 103, and an MSB-side bit position detector 104 as major circuits.

The edge detector 101 is a circuit that detects the transition (edge) of the value of a bit string that constitutes input data. The edge detector 101 detects the transition (edge) of a bit string that constitutes input data. The edge detector 101 outputs a detection result as an edge detection result 105 to the OR circuit 102.

Specifically, the edge detector 101 calculates a value indicating whether the n-th bit and the (n+1)th bit from the MSB of a bit string that constitutes input data are different or not (n is an integer of 0 or above). The edge detector 101 sets the calculated value at the n-th bit from the MSB. The edge detector 101 generates a bit string in which the calculated value is set in this manner as a detection result. Note that the 0th bit from the MSB is the MSB. In the first exemplary embodiment, the case where the value indicating whether the bit values are different or not is 1 (transition value) when the bit values are different and it is 0 (non-transition value) when the bit values are not different is described by way of illustration. In other words, in the first exemplary embodiment, the case where the value indicating whether the bit values are different or not is 0 when the bit values are equal is described by way of illustration. The edge detector 101 functions as the bit string generator 51.

The OR circuit 102 calculates the logical OR of the edge detection result 105 which is output from the edge detector 101 and a register value 107 which is output from the register 103. The OR circuit 102 outputs the calculated logical OR as an OR value 106 to the register 103.

The register 103 is a circuit that stores the OR value 106 which is output from the OR circuit 102 for each operation cycle based on the input clock signal. The register 103 outputs the stored OR value as the register value 107 to the OR circuit 102 and the MSB-side bit position detector 104 for each operation cycle. Further, the register 103 recognizes the last operation cycle in which the final OR value 106 based on the last input data of the block is input from the OR circuit 102 by referring to the block end signal. In the cycle following the last operation cycle of each block, the register 103 resets the OR value which is stored for each block to the initial value 0. The register 103 resets the stored OR value after outputting the final OR value 106 to the MSB-side bit position detector 104.

The MSB-side bit position detector 104 detects the bit position of the transition value on the MSB side of the bit string that constitutes the register value 107 which is output from the register 103. The MSB-side bit position detector 104 is a circuit that calculates the maximum exponent from the detected bit position and outputs it. Specifically, when the position where the bit value is 1 of the register value 107 which is output from the register 103 is the M-th bit from the MSB side (M is an integer of 0 or above), the MSB-side bit position detector 104 outputs −1×M as the maximum exponent.

For example, in the case where the position where the bit value is 1 of the register value 107 is the 1st bit from the MSB side, the values of the 0th bit and 1st bit from the MSB side are the same in all of the input data. On the other hand, in this case, the value of the 1st bit and the 2nd bit from the MSB side are different in any of the input data. Thus, according to the above-described expression (−1×M), −1×1=−1 can be obtained as the maximum exponent that corresponds to the shift amount by which the normalized value is accurately represented with any signs of the input data remaining unchanged.

While the register 103 outputs the register value 107 for each operation cycle, the MSB-side bit position detector 104 calculates the maximum exponent based on the register value 107 that indicates the final OR value as the block. The MSB-side bit position detector 104 recognizes the cycle in which the register value 107 that indicates the final OR value as the block is output from the register 103 by referring to the block end signal. The MSB-side bit position detector 104 detects the bit position on the MSB side of the bit string that constitutes the register value 107 indicating the final OR value. The MSB-side bit position detector 104 calculates the maximum exponent from the detected bit position. The MSB-side bit position detector 104 outputs the calculated maximum exponent.

The OR circuit 102, the register 103 and the MSB-side bit position detector 104 function as the exponent calculator 52.

A configuration of the edge detector 101 is described hereinafter with reference to FIG. 3. The edge detector 101 includes a plurality of exclusive OR (XOR) circuit 110. The edge detector 101 calculates and outputs the exclusive OR of each adjacent bits of a bit string that constitutes input data. Specifically, when the input data is composed of a bit string of Y bits, the edge detector 101 is composed of (Y−1) number of XOR circuits 110 (Y is a positive integer).

Figure 3:
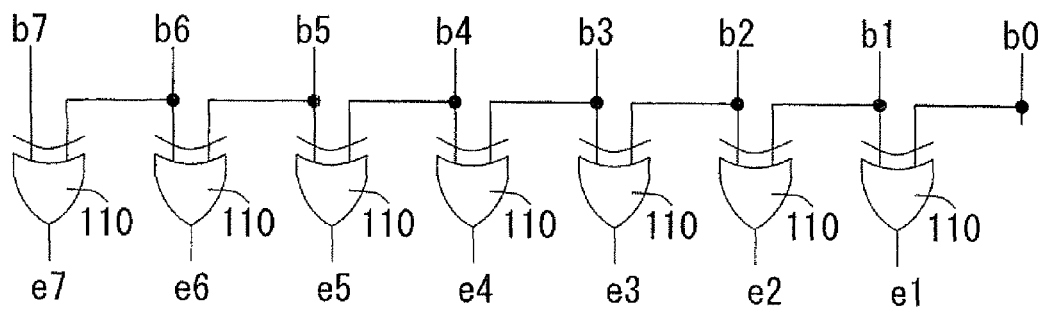
FIG. 3 is a block diagram showing a configuration of an edge detector according to the first exemplary embodiment of the present invention.

FIG. 3 shows a configuration example of the edge detector 101 when input data is composed of a bit string of eight bits, b7 to b0. The edge detector 101 calculates the exclusive OR of each adjacent bits of the bit string that constitutes the input data. The edge detector 101 outputs the calculated exclusive OR as edge detection results e7 to e1 to the OR circuit 102. The bit b7 of the input data and the bit e7 of the edge detection result are MSB.

[Operation of First Exemplary Embodiment]

Figure 4:
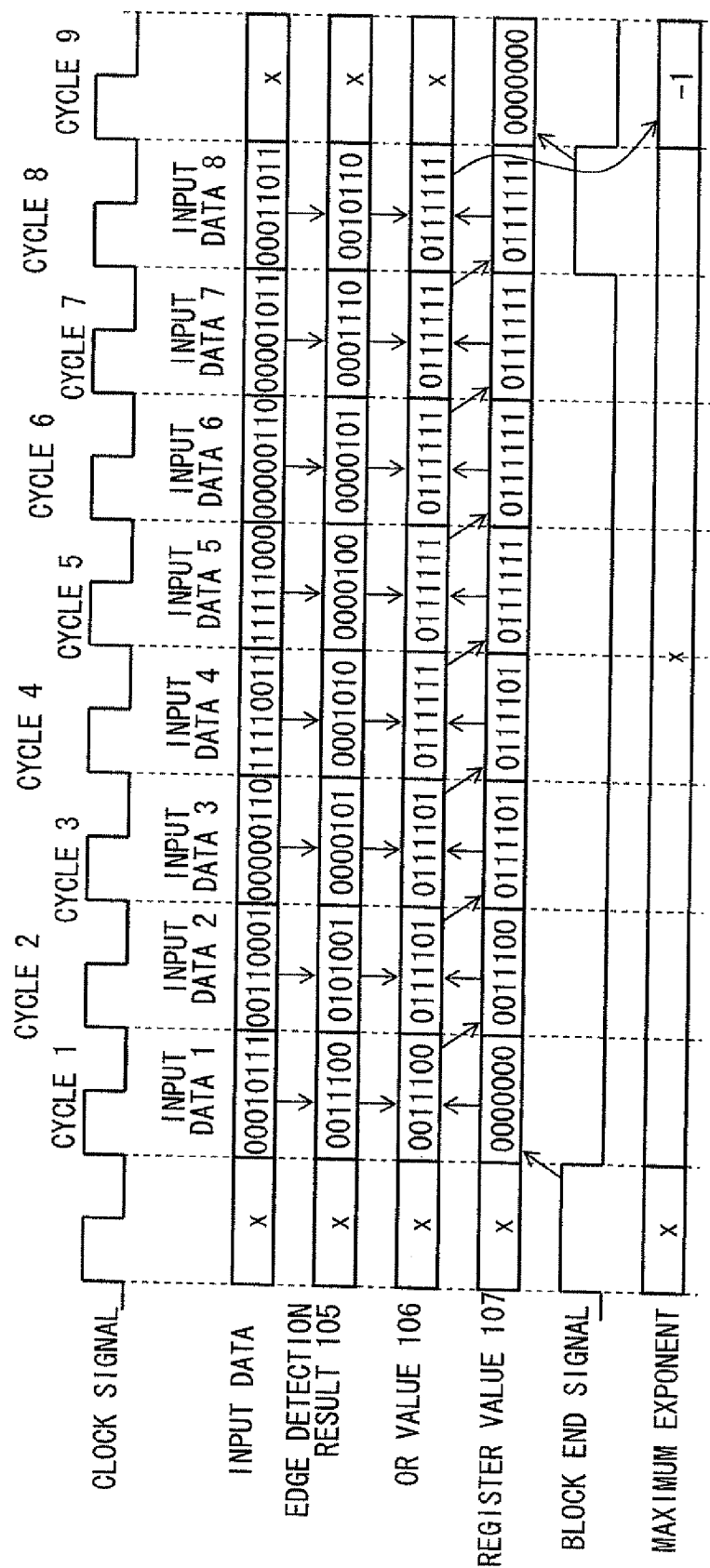
FIG. 4 is a timing chart showing an operation of a maximum exponent calculator according to the first exemplary embodiment of the present invention.

The operation of the maximum exponent calculator according to the first exemplary embodiment of the present invention is described hereinafter with reference to FIG. 4. FIG. 4 is a timing chart showing the operation of the maximum exponent calculator 100 according to the first exemplary embodiment of the present invention. The maximum exponent calculator 100 performs an operation based on an input clock signal.

Consider a block composed of eight data, input data 1 to input data 8, shown below as an example of a block to be normalized. Each input data is eight bits. In the following, the value of each data is represented by two's complement. Note that, in the bit string of the data shown hereinbelow, the leftmost bit is MSB, and the rightmost bit is LSB. The MSB is a sign bit.

Input data 1: 00010111
Input data 2: 00110001
Input data 3: 00000110
Input data 4: 11110011
Input data 5: 11111000
Input data 6: 00000110
Input data 7: 00001011
Input data 8: 00011011

(Cycle 1)

Firstly, in the first cycle (the cycle 1) of the operation cycle, the input data 1 is input to the maximum exponent calculator 100. The edge detector 101 detects the transition (edge) of the value of the bit string that constitutes the input data 1. The edge detector 101 outputs a detection result as an edge detection result 1 to the OR circuit 102. To be more specific, the edge detector 101 calculates and outputs the exclusive OR of each adjacent bits of the bit string that constitutes the input data 1.

Edge Detection Result 1: 0011100

Next, the OR circuit 102 calculates the logical OR of the edge detection result 1 which is output from the edge detector 101 and the register value 1 which is output from the register 103. The OR circuit 102 outputs the calculated logical OR as an OR value 1 to the register 103. The value of the register value 1 in the cycle 1 is an initial value 0.

OR Value 1: 0011100

The register 103 stores the OR value 1 which is output from the OR circuit 102 in the cycle 1. The register 103 then outputs the stored OR value 1 as a register value 2 in the cycle 2, which is the next operation cycle.

(Cycle 2)

Next, in the second cycle (the cycle 2) of the operation cycle, the input data 2 is input to the maximum exponent calculator 100. The edge detector 101 detects the transition (edge) of the value of the bit string that constitutes the input data 2. The edge detector 101 outputs a detection result as an edge detection result 2 to the OR circuit 102. To be more specific, the edge detector 101 calculates and outputs the exclusive OR of each adjacent bits of the bit string that constitutes the input data 2.

Edge Detection Result 2: 0101001

Next, the OR circuit 102 calculates the logical OR of the edge detection result 2 which is output from the edge detector 101 and the register value 2 which is output from the register 103. The OR circuit 102 outputs the calculated logical OR as an OR value 2 to the register 103. The value of the register value 2, which is the output of the register 103 in the cycle 2, is the OR value 1 which is stored in the cycle 1.

OR Value 2: 0111101

The register 103 stores the OR value 2 which is output from the OR circuit 102 in the cycle 2. The register 103 then outputs the stored OR value 2 as a register value 3 in the cycle 3, which is the next operation cycle.

(Cycles 3 to 8)

In the cycles 3 to 8, the input data 3 to 8 are input to the maximum exponent calculator 100 in each operation cycle in the same manner. The edge detector 101 detects the transition (edge) of the value of a bit string that constitutes each of the input data 3 to 8. The edge detector 101 outputs each of detection results as edge detection results 3 to 8.

Edge detection result 3: 0000101
Edge detection result 4: 0001010
Edge detection result 5: 0000100
Edge detection result 6: 0000101
Edge detection result 7: 0001110
Edge detection result 8: 0010110

In each cycle, the OR circuit 102 calculates the logical OR of each of the edge detection results 3 to 8 which are output from the edge detector 101 and each of the register values which are output from the register 103. The OR circuit 102 outputs each of the calculated logical OR as OR values 3 to 8 to the register 103. The values of the register values 3 to 8, which are the outputs of the register 103 in the cycles 3 to 8, are the OR value 2 to 7 which are stored in the cycles 2 to 7, respectively.

OR value 3: 0111101
OR value 4: 0111111
OR value 5: 0111111
OR value 6: 0111111
OR value 7: 0111111
OR value 8: 0111111

In the cycle 9, which is the cycle following the last operation cycle of the block, the MSB-side bit position detector 104 detects the bit position of the transition value on the MSB side of the bit string that constitutes the OR value 8 for the final OR value 8 as the block. The MSB-side bit position detector 104 calculates the maximum exponent from the detected bit position. The MSB-side bit position detector 104 outputs the calculated maximum exponent. Specifically, because the bit position where the bit value is 1 of the OR value 8 is the 1st bit from the MSB, the maximum exponent is $-1 \times 1 = -1$ according to the above-described expression $(-1 \times M)$. Thus, the MSB-side bit position detector 104 outputs −1 as the maximum exponent.

Further, in the cycle 9, which is the cycle following the last operation cycle of the block, the register 103 resets the stored OR value for the block to the initial value 0. As a result, the register 103 outputs the initial value 0 in the next cycle.

The MSB-side bit position detector 104 and the register 103 identify the cycle in which the value of the input block end signal becomes 1 as the last operation cycle of each block. In FIG. 4, because the value of the block end signal becomes 1 in the cycle 8, the cycle 8 is the last operation cycle of the block.

A case where the maximum value on the negative side is contained in input data is described hereinbelow. In the case of 8-bit input data, the maximum value on the negative side is $-1 \times$ (the 7th power of 2)$=-128$, and it is 10000000 when represented by two's complement. The edge detection result of the input data is 1000000. Thus, the MSB of the final OR value as the block is 1, and the maximum exponent of the block in which the maximum value on the negative side is contained in the input data is calculated to be 0. Therefore, according to the first exemplary embodiment, the accurate maximum exponent can be calculated even when the maximum value on the negative side is contained in input data.

[Advantageous Effect of First Exemplary Embodiment]

The first exemplary embodiment has a feature that the normalization process of a block floating point calculates the maximum exponent using the edge detector 101. Because the edge detector 101 simply calculates the exclusive OR of each adjacent bits of a bit string that constitutes input data, it can be implemented by a circuit having a simple configuration with a single logical stage composed of a plurality of XOR circuits.

Thus, compared with the normalization process that calculates the absolute value of input data as described in Background Art, the maximum exponent calculator according to the first exemplary embodiment can calculate the maximum exponent at high speed and allow reduction of the circuit scale and power consumption.

Further, the maximum exponent calculator according to the first exemplary embodiment can process data accurately even when the maximum value on the negative side is contained in input data. Therefore, the maximum exponent calculator according to the first exemplary embodiment has a feature that, even when the value of data is the maximum value on the negative side, it is not necessary to process the data in an exceptional manner or not to use the maximum value on the negative side.

Second Exemplary Embodiment

A block floating point normalization circuit according to a second exemplary embodiment of the present invention is described hereinafter with reference to FIG. 5. In the second exemplary embodiment of the present invention, a specific example of a block floating point normalization circuit using the maximum exponent calculator according to the first exemplary embodiment is described.

Figure 5:
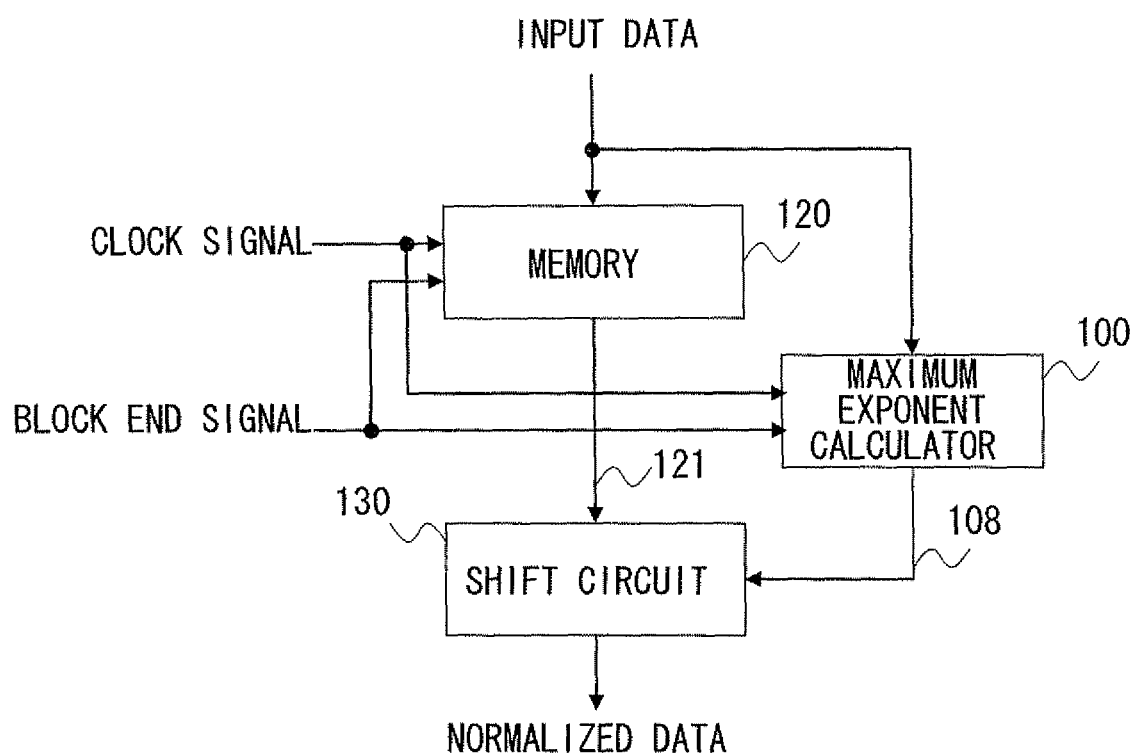
FIG. 5 is a block diagram showing a configuration of a normalization circuit according to a second exemplary embodiment of the present invention.

FIG. 5 is a block diagram showing a configuration of a block floating point normalization circuit (which is referred to hereinafter as a normalization circuit) according to the second exemplary embodiment of the present invention.

In FIG. 5, the normalization circuit according to the second exemplary embodiment performs block floating point normalization for each of input data that constitute a block. The normalization circuit outputs data obtained by normalizing the input data as normalized data.

Referring to FIG. 5, the normalization circuit according to the second exemplary embodiment includes a memory 120, the maximum exponent calculator 100 according to the first exemplary embodiment, and a shift circuit 130.

The maximum exponent calculator 100 according to the first exemplary embodiment calculates the maximum exponent of input data. The maximum exponent calculator 100 outputs the calculated maximum exponent as a maximum exponent 108 to the shift circuit 130.

The memory 120 stores input data while the maximum exponent calculator 100 calculates the maximum exponent of the input data. The input data are sequentially input to the memory 120 and the maximum exponent calculator 100 from an external device (not shown), for example. The memory 120 sequentially stores the input data that are input from the external device. Further, the memory 120 sequentially outputs the stored input data as input data 121 to the shift circuit 130 after the maximum exponent calculator 100 completes the calculation of the maximum exponent.

The shift circuit 130 shifts the input data which are output from the memory 120 based on the maximum exponent 108 calculated by the maximum exponent calculator 100 to thereby perform normalization.

[Operation of Second Exemplary Embodiment]

Figure 6:
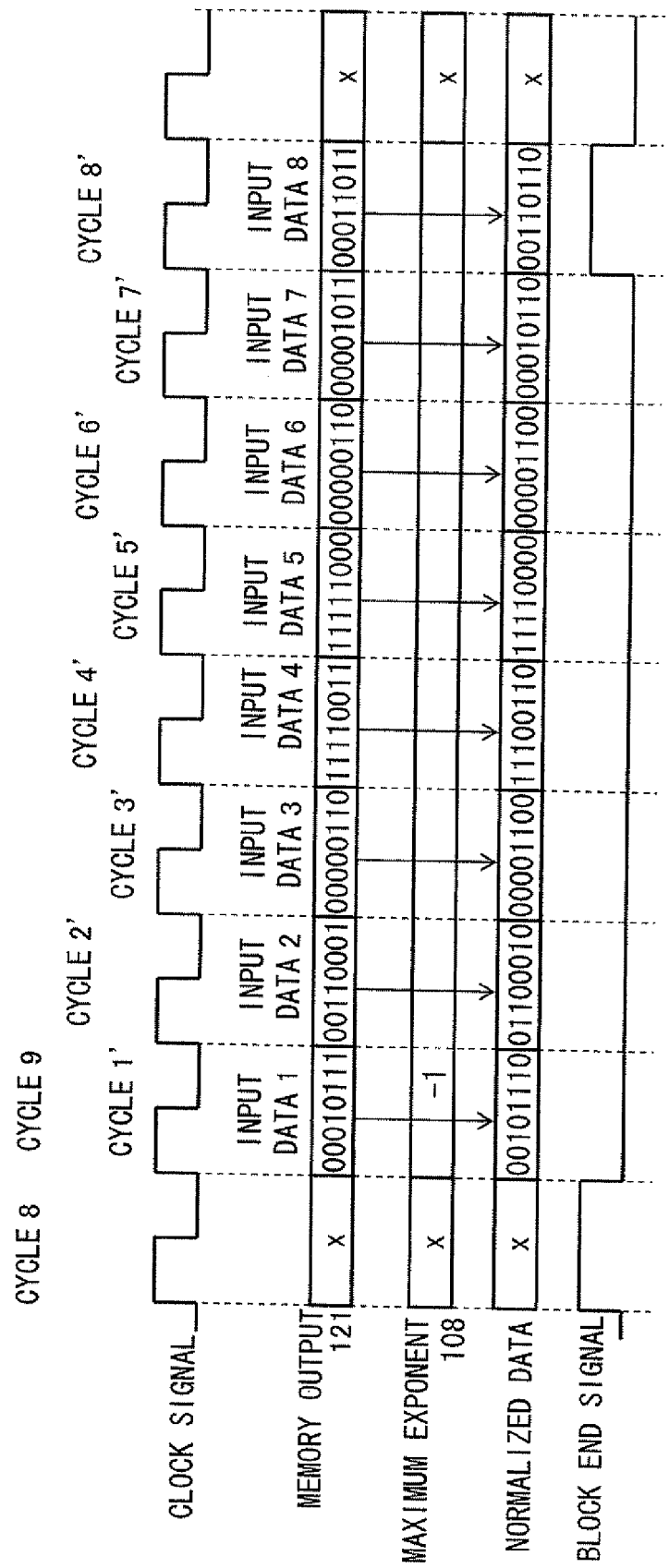
FIG. 6 is a timing chart showing an operation of a normalization circuit according to the second exemplary embodiment of the present invention.

The operation of the normalization circuit according to the second exemplary embodiment of the present invention is described hereinafter with reference to FIG. 6. FIG. 6 is a timing chart showing the operation of the normalization circuit according to the second exemplary embodiment of the present invention. The normalization circuit according to the second exemplary embodiment of the present invention performs an operation based on an input clock signal.

Consider a block composed of eight data, input data 1 to input data 8, shown below as an example of a block to be normalized, as in the first exemplary embodiment. Each input data is eight bits. In the following, the value of each data is represented by two's complement.
Input data 1: 00010111
Input data 2: 00110001
Input data 3: 00000110
Input data 4: 11110011
Input data 5: 11111000
Input data 6: 00000110
Input data 7: 00001011
Input data 8: 00011011

FIG. 6 shows an operation in the cycle 1' to the cycle 8' after the maximum exponent calculator 100 calculates the maximum exponent of input data in the cycle 1 to the cycle 8 shown in FIG. 4. The illustration of the operation of the cycles 1 to 7 is omitted because it is the same as shown in FIG. 4. Further, the cycle 9 and the cycle 1' are the same operation cycle.

The memory 120 stores input data while the maximum exponent calculator 100 calculates the maximum exponent of the input data in the cycles 1 to 8. After the maximum exponent calculator 100 completes the calculation of the maximum exponent, the memory 120 sequentially outputs the stored input data to the shift circuit 130 in the cycles 1' to 8'. The memory 120 identifies the timing when the maximum exponent calculator 100 completes the calculation of the maximum exponent by referring to the block end signal. Specifically, the memory 120 starts the output of the stored input data 1 to 8 from the cycle 9, which is the cycle following the cycle 8 where the value of the block end signal becomes 1.

Further, the memory 120 identifies the timing to end the output of the input data by referring to the block end signal. Specifically, the memory 120 ends the output of the input data in the cycle 8' where the value of the block end signal becomes 1 again. For example, an external device outputs the block end signal with the value 1 in the cycle 8' where the cycles corresponding to the input data 1 to 8 have elapsed.

The maximum exponent calculator 100 calculates the maximum exponent of the input data in the cycles 1 to 8. Next, the maximum exponent calculator 100 outputs −1 as the calculated maximum exponent to the shift circuit 130 in the cycle 9. The maximum exponent calculator 100 continues to output the maximum exponent −1 until the cycle 8' where the memory 120 completes the output of the stored input data.

The maximum exponent calculator 100 identifies the timing to end the output of the maximum exponent by referring to the block end signal. Specifically, the maximum exponent calculator 100 ends the output of the maximum exponent in the cycle 8' where the value of the block end signal becomes 1 again.

In the cycles 1' to 8', the shift circuit 130 performs normalization by sequentially shifting the input data 1 to 8 which are output from the memory 120 based on the maximum exponent −1 which is calculated and output by the maximum exponent calculator 100. Then, the shift circuit 130 outputs data obtained by normalizing the input data 1 to 8 as normalized data 1 to 8. When the maximum exponent which is output from the maximum exponent calculator 100 is −m, the shift circuit 130 shifts the input data 1 to 8 to the left by m bits, thereby normalizing the input data 1 to 8 (m is an integer of 0 or above).

As a result, the normalized data 1 to 8 which are output from the shift circuit 130 are as follows, and the normalization ends correctly. Data after normalization of the input data k is referred to as the normalized data k (k is a positive integer of any one of 1 to 8.).

Normalized data 1: 00101110
Normalized data 2: 01100010
Normalized data 3: 00001100
Normalized data 4: 11100110
Normalized data 5: 11110000
Normalized data 6: 00001100
Normalized data 7: 00010110
Normalized data 8: 00110110

[Advantageous Effect of Second Exemplary Embodiment]

According to the second exemplary embodiment, because the maximum exponent calculator 100 according to the first exemplary embodiment is used for the calculation of the maximum exponent with a large processing volume in the normalization of a block floating point, it is possible to reduce the circuit scale and power consumption required for the calculation of the maximum exponent. Further, the normalization circuit according to the second exemplary embodiment includes the maximum exponent calculator 100 that can calculate the maximum exponent at high speed and allow reduction of the circuit scale and power consumption. Then, the normalization circuit executes the normalization of a block floating point based on the maximum exponent that is calculated by the maximum exponent calculator 100. As a result, according to the second exemplary embodiment, it is possible to execute the normalization of a block floating point at high speed and reduce the circuit scale and power consumption.

Third Exemplary Embodiment

A third exemplary embodiment of the present invention is described hereinafter with reference to the drawings.

Figure 7:
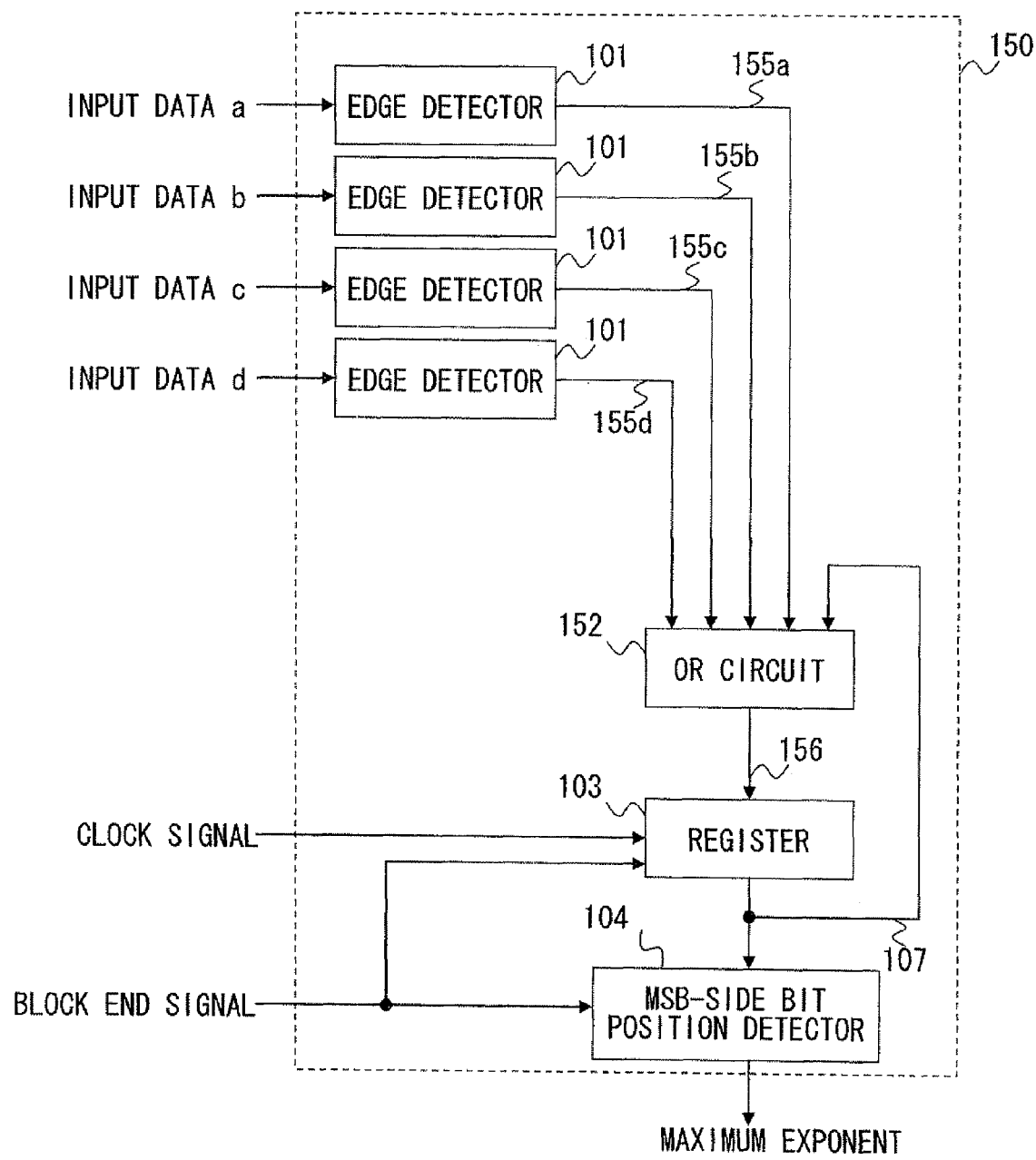
FIG. 7 is a block diagram showing a configuration of a maximum exponent calculator according to a third exemplary embodiment of the present invention.

FIG. 7 is a block diagram showing a configuration of a maximum exponent calculator 150 according to the third exemplary embodiment of the present invention. The maximum exponent calculator 150 is a circuit that calculates the maximum exponent of all data in a block which is composed of a plurality of input data. The maximum exponent calculator 150 has a feature that it executes the edge detection in parallel and thereby calculates the maximum exponent at high speed. In FIG. 7, the same elements as those of the maximum exponent calculator 100 according to the first exemplary embodiment of the present invention are denoted by the same reference symbols.

Specifically, all data in the block are sequentially input, four data at a time, to the maximum exponent calculator 150 based on an input clock signal, and the maximum exponent calculator 150 calculates the maximum exponent of all data in the block. The maximum exponent calculator 150 outputs the calculated maximum exponent for each block. At this time, the maximum exponent calculator 150 identifies the end of the block by referring to an input block end signal.

The maximum exponent calculator 150 includes four edge detectors 101, an OR circuit 152, a register 103, and an MSB-side bit position detector 104 as major circuits.

The edge detector 101 is a circuit that detects the transition (edge) of the value of a bit string that constitutes input data. Input data a to d are respectively input to the four edge detectors 101. The four edge detectors 101 detect the transition (edge) of the value of a bit string that constitutes each input data. The four edge detectors 101 output detection results as edge detection results 155a to 155d to the OR circuit 152.

The OR circuit 152 is a 5-input circuit, and the edge detection results 155a to 155d which are output from the four edge detectors 101 and a register value 107 which is output from the register 103 are input to the OR circuit 152. The OR circuit 152 calculates the logical OR of the input edge detection results 155a to 155d and the register value 107. The OR circuit 152 outputs the calculated logical OR as an OR value 156 to the register 103.

The register 103 is a circuit that stores the OR value 156 which is output from the OR circuit 152 for each operation cycle based on the input clock signal. The register 103 outputs the stored OR value as the register value 107 to the OR circuit 152 and the MSB-side bit position detector 104 for each operation cycle. Further, the register 103 recognizes the last operation cycle by referring to the block end signal. In the cycle following the last operation cycle of the block, the register 103 resets the OR value which is stored for the block to the initial value 0.

The MSB-side bit position detector 104 detects the bit position of the transition value on the MSB side of the bit string that constitutes the register value 107 which is output from the register 103. The MSB-side bit position detector 104 is a circuit that calculates the maximum exponent from the detected bit position and outputs it. Specifically, when the position where the bit value is 1 of the register value 107 which is output from the register 103 is the M-th bit from the MSB side (M is an integer of 0 or above), the MSB-side bit position detector 104 outputs $-1 \times M$ as the maximum exponent.

While the register 103 outputs the register value 107 for each operation cycle, the MSB-side bit position detector 104 calculates the maximum exponent based on the final register value 107 as the block. The MSB-side bit position detector 104 recognizes the cycle in which the register value 107 that indicates the final OR value as the block is output from the register 103 by referring to the block end signal. The MSB-side bit position detector 104 detects the bit position of the transition value on the MSB side of the bit string that constitutes the register value 107 indicating the final OR value and thereby calculates the maximum exponent. The MSB-side bit position detector 104 outputs the maximum exponent.

[Operation of Third Exemplary Embodiment]

Figure 8:
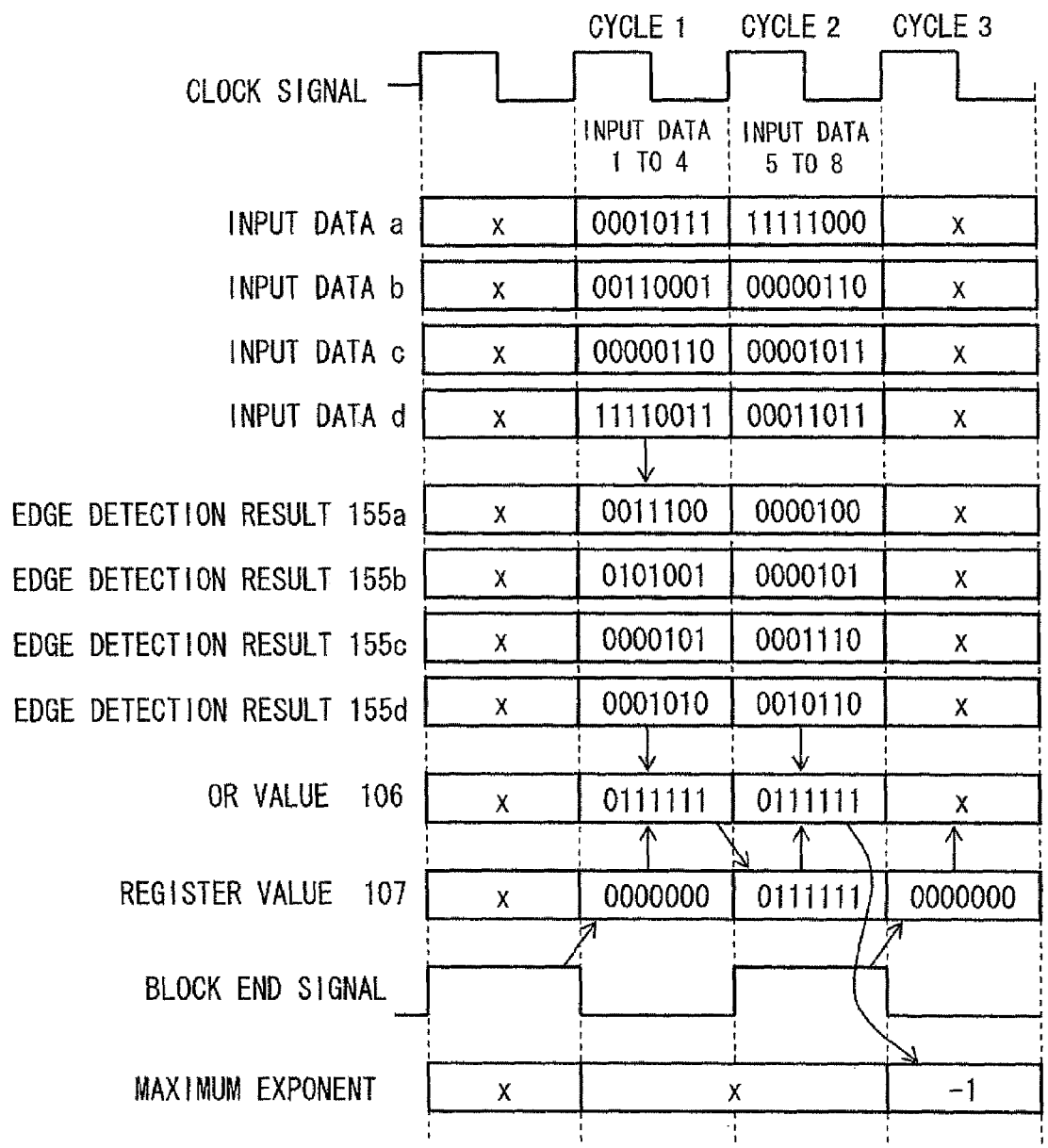
FIG. 8 is a timing chart showing an operation of a maximum exponent calculator according to the third exemplary embodiment of the present invention.

The operation of the maximum exponent calculator according to the third exemplary embodiment of the present invention is described hereinafter with reference to FIG. 8. FIG. 8 is a timing chart showing the operation of the maximum exponent calculator 150 according to the third exemplary embodiment of the present invention. The maximum exponent calculator 150 performs an operation based on an input clock signal.

Consider a block composed of eight data, input data 1 to input data 8, shown below as an example of a block to be normalized. Each input data is eight bits. In the following, the value of each data is represented by two's complement.
Input data 1: 00010111
Input data 2: 00110001
Input data 3: 00000110
Input data 4: 11110011
Input data 5: 11111000
Input data 6: 00000110
Input data 7: 00001011
Input data 8: 00011011
(Cycle 1)

Firstly, in the first cycle (the cycle 1) of the operation cycle, the four input data 1 to 4 are input to the maximum exponent calculator 150. Each of the four edge detectors 101 detects the transition (edge) of the value of the bit string that constitutes the input data 1 to 4. The four edge detectors 101 output detection results as edge detection results 1a to 1d to the OR circuit 152. To be more specific, each edge detector 101 calculates and outputs the exclusive OR of each adjacent bits of the bit string that constitutes the input data 1a to 1d. A detection result of the input data 1 is the edge detection result 1a, a detection result of the input data 2 is the edge detection result 1b, a detection result of the input data 3 is the edge detection result 1c, and a detection result of the input data 4 is the edge detection result 1d.
Edge detection result 1a: 0011100
Edge detection result 1b: 0101001
Edge detection result 1c: 0000101
Edge detection result 1d: 0001010

Next, the OR circuit 152 calculates the logical OR of the edge detection results 1a to 1d which are respectively output from the four edge detectors 101 and the register value 1 which is output from the register 103. The OR circuit 152 outputs the calculated logical OR as an OR value 1 to the register 103. The value of the register value 1 in the cycle 1 is an initial value 0.
OR Value 1: 0111111

The register 103 stores the OR value 1 which is output from the OR circuit 152 in the cycle 1. The register 103 then outputs the stored OR value 1 as a register value 2 in the cycle 2, which is the next operation cycle.
(Cycle 2)

Next, in the second cycle (the cycle 2) of the operation cycle, four input data 5 to 8 are input to the maximum exponent calculator 150. Each of the four edge detectors 101 detects the transition (edge) of the value of the bit string that constitutes the input data 5 to 8. The edge detectors 101 output detection results as edge detection results 2a to 2d to the OR circuit 152. To be more specific, each edge detector 101 calculates and outputs the exclusive OR of each adjacent bits of the bit string that constitutes the input data 2a to 2d. A detection result of the input data 5 is the edge detection result 2a, a detection result of the input data 6 is the edge detection result 2b, a detection result of the input data 7 is the edge detection result 2c, and a detection result of the input data 8 is the edge detection result 2d.
Edge detection result 2a: 0000100
Edge detection result 2b: 0000101
Edge detection result 2c: 0001110
Edge detection result 2d: 0010110

Next, the OR circuit 152 calculates the logical OR of the edge detection results 2a to 2d which are respectively output from the four edge detectors 101 and the register value 2 which is output from the register 103. The OR circuit 152 outputs the calculated logical OR as an OR value 2 to the register 103. The value of the register value 2, which is the output of the register 103 in the cycle 2, is the OR value 1 which is stored in the cycle 1.
OR Value 2: 0111111

Because the cycle 3 is the cycle following the last operation cycle of the block, the MSB-side bit position detector 104 detects the bit position of the transition value on the MSB side of the bit string that constitutes the OR value for the final OR value 2 as the block. The MSB-side bit position detector 104 calculates the maximum exponent from the detected bit position. The MSB-side bit position detector 104 outputs the calculated maximum exponent. Specifically, because the bit position where the bit value is 1 of the OR value 2 is the 2nd bit from the MSB, the MSB-side bit position detector 104 outputs $-1$ as the maximum exponent.

Further, because the cycle 3 is the cycle following the last operation cycle of the block, the register 103 resets the stored OR value for the block to the initial value 0. As a result, the register 103 outputs the initial value 0 in the next cycle.

The MSB-side bit position detector 104 and the register 103 identify the cycle in which the value of the input block end signal becomes 1 as the last operation cycle of each block. In FIG. 8, because the value of the input block end signal becomes 1 in the cycle 2, the cycle 2 is the last operation cycle of the block.

A case where the maximum value on the negative side is contained in input data is described hereinbelow. In the case of 8-bit input data, the maximum value on the negative side of the data is −1×(the 7th power of 2)=−128, and it is 10000000 when represented by two's complement. The edge detection result of the input data is 1000000. Thus, the MSB of the final OR value as the block is 1, and the maximum exponent of the block in which the maximum value on the negative side is contained in the input data is calculated to be 0. Therefore, in the third exemplary embodiment also, the accurate maximum exponent can be calculated even when the maximum value on the negative side is contained in input data.

[Advantageous Effect of Third Exemplary Embodiment]

The third exemplary embodiment has a feature that, in the normalization of a block floating point, the maximum exponent is calculated using the edge detectors 101. Because the edge detector 101 simply calculates the exclusive OR of each adjacent bits of a bit string that constitutes input data, it can be implemented by a circuit having a simple configuration with a single logical stage composed of a plurality of XOR circuits.

Thus, compared with the normalization process that requires an absolute value circuit that calculates the absolute value of input data as described in Background Art, the maximum exponent calculator according to the third exemplary embodiment can calculate the maximum exponent at high speed and allow reduction of the circuit scale and power consumption.

Further, the maximum exponent calculator according to the third exemplary embodiment can process data accurately even when the maximum value on the negative side is contained in input data. Therefore, the maximum exponent calculator according to the third exemplary embodiment has a feature that, even when the value of data is the maximum value on the negative side, it is not necessary to process the data in an exceptional manner or not to use the maximum value on the negative side.

Further, the maximum exponent calculator according to the third exemplary embodiment has a feature that it includes four edge detectors 101 and executes the edge detection in parallel and it can thereby calculate the maximum exponent at high speed.

Although the case of including four edge detectors 101 and executing the edge detection in parallel of four is described in the third exemplary embodiment, the number of edge detectors 101 may be arbitrary. For example, FIG. 9 shows a configuration example of a maximum exponent calculator 160 that includes N number of edge detectors 101 and executes the edge detection in parallel of N (N is an integer of 2 or above).

Figure 9:
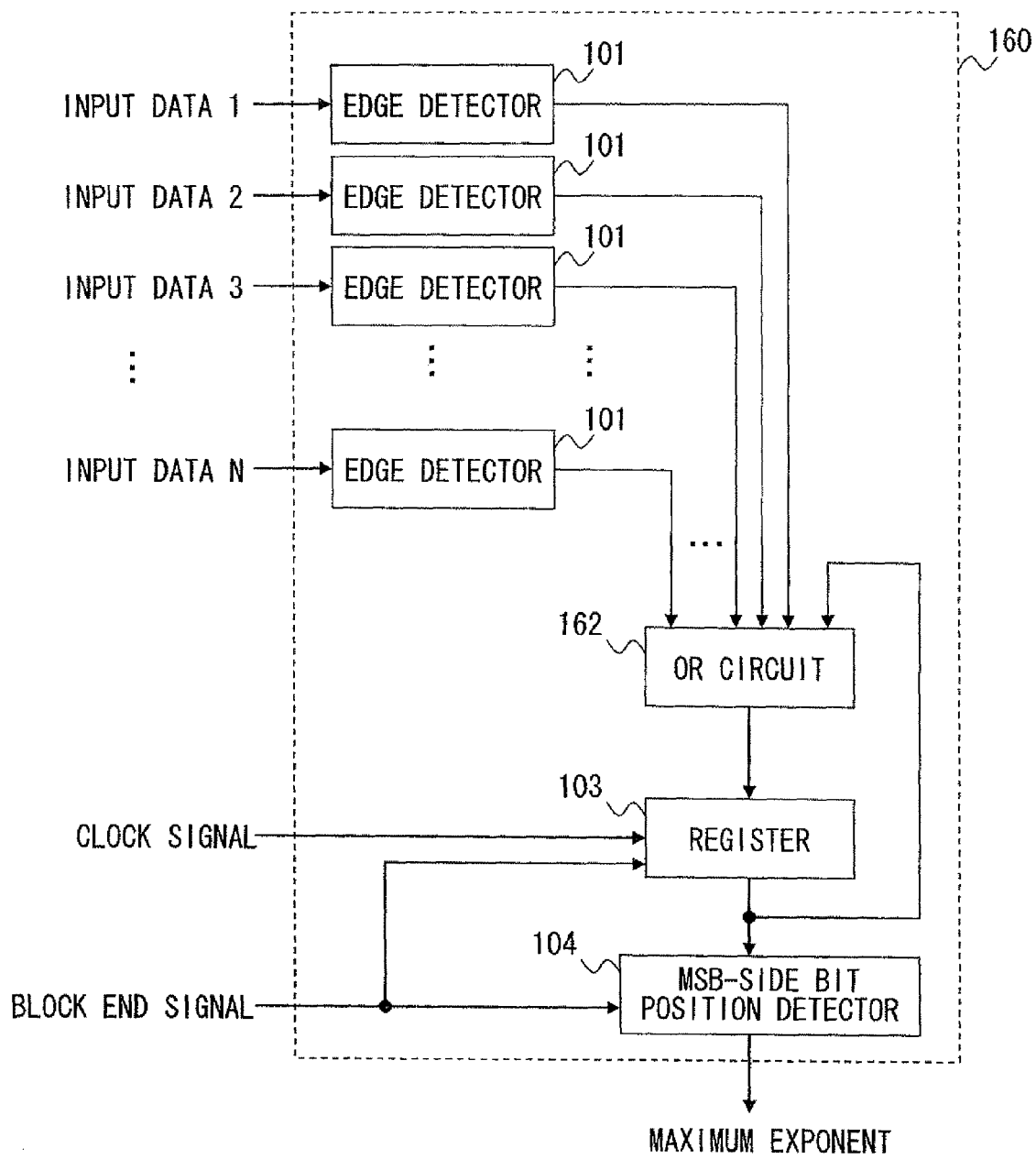
FIG. 9 is a block diagram showing another configuration example of a maximum exponent calculator according to the third exemplary embodiment of the present invention.

In FIG. 9, an (N+1) input OR circuit 162 that is included in the maximum exponent calculator 160 calculates the logical OR of N number of edge detection results which are output from the N number of edge detectors 101 and the register value 107 which is output from the register 103.

Fourth Exemplary Embodiment

A block floating point normalization circuit according to a fourth exemplary embodiment of the present invention is described hereinafter with reference to FIG. 10. In the fourth exemplary embodiment of the present invention, a specific example of a block floating point normalization circuit using the maximum exponent calculator according to the third exemplary embodiment is described.

Figure 10:
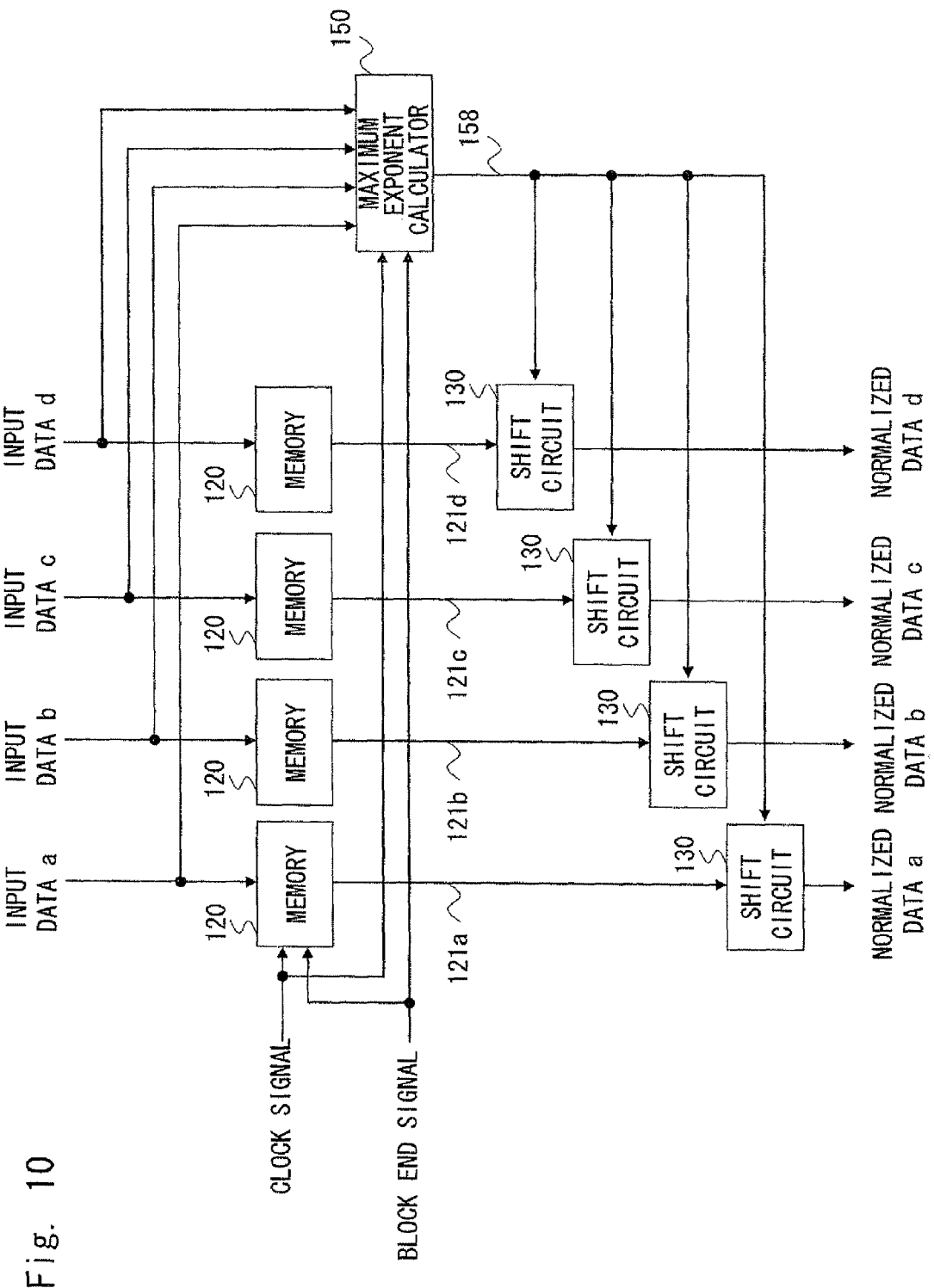
FIG. 10 is a block diagram showing a configuration of a normalization circuit according to a fourth exemplary embodiment of the present invention.

FIG. 10 is a block diagram showing a configuration of a block floating point normalization circuit (which is referred to hereinafter as a normalization circuit) according to the fourth exemplary embodiment of the present invention.

In FIG. 10, the normalization circuit according to the fourth exemplary embodiment performs block floating point normalization for each of input data that constitute a block. The normalization circuit outputs data obtained by normalizing the input data as normalized data. Four input data are simultaneously input to the normalization circuit according to the fourth exemplary embodiment, and the normalization circuit simultaneously outputs four normalized data obtained by normalizing the simultaneously input four input data.

Figure 11:
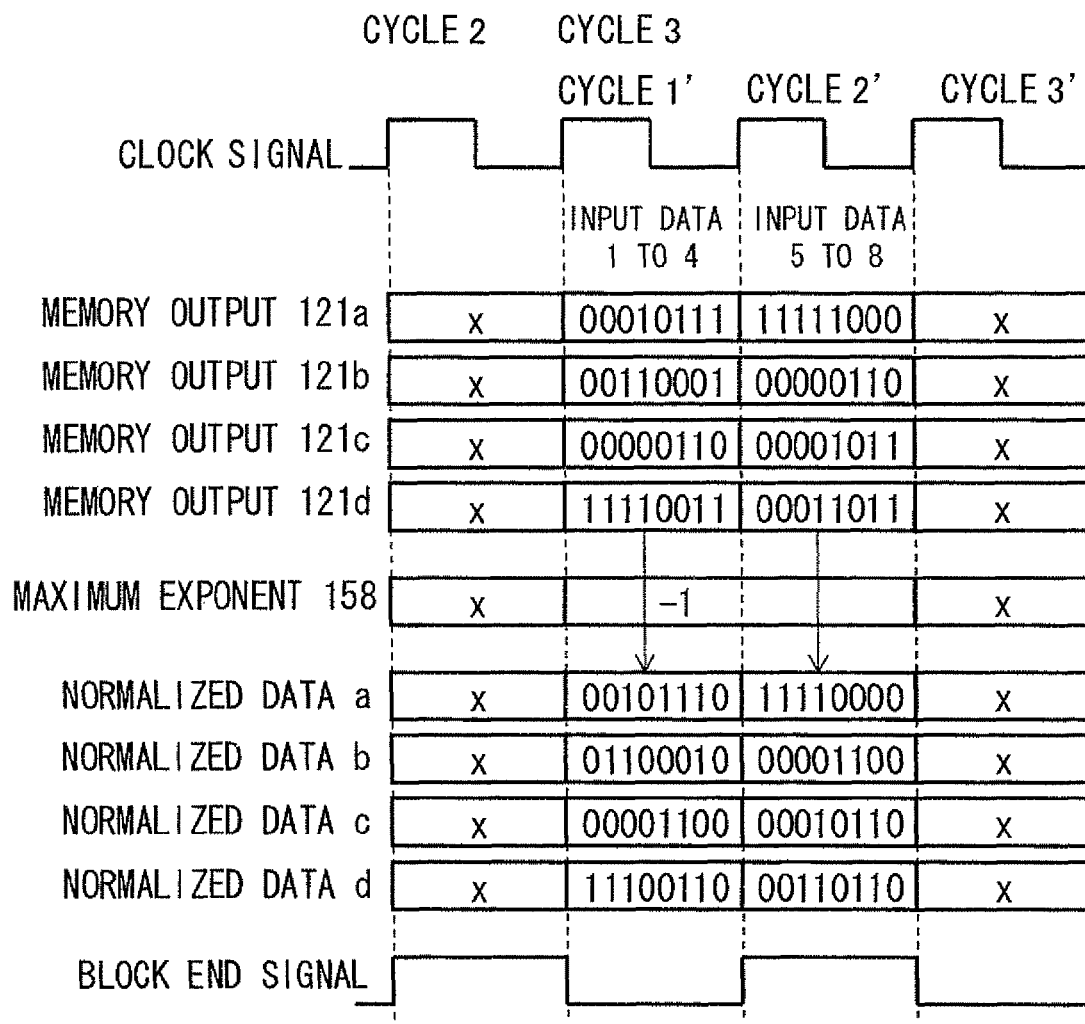
FIG. 11 is a timing chart showing an operation of a normalization circuit according to the fourth exemplary embodiment of the present invention.

Referring to FIG. 11, the normalization circuit according to the fourth exemplary embodiment includes four memories 120, the maximum exponent calculator 150 according to the third exemplary embodiment, and four shift circuits 130.

The maximum exponent calculator 150 according to the third exemplary embodiment calculates the maximum exponent for input data a to d. The maximum exponent calculator 150 outputs the calculated maximum exponent as a maximum exponent 158 to the four shift circuits 130.

The four memories 120 respectively store the input data a to d while the maximum exponent calculator 150 calculates the maximum exponent of the input data. The input data are sequentially input, in groups of four each, to each of the four memories 120 and the maximum exponent calculator 100 from an external device (not shown), for example. The four memories 120 sequentially store the input data which are input from the external device. Further, the four memories 120 sequentially output the stored input data a to d as input data 121a to d to the shift circuit 130 after the maximum exponent calculator 150 completes the calculation of the maximum exponent.

The four shift circuits 130 respectively shift the input data 121a to d which are output from the four memories 120 based on the maximum exponent 158 which is calculated by the maximum exponent calculator 150 for the input data, thereby performing normalization.

[Operation of Fourth Exemplary Embodiment]

The operation of the normalization circuit according to the fourth exemplary embodiment of the present invention is described hereinafter with reference to FIG. 11. FIG. 11 is a timing chart showing the operation of the normalization circuit according to the fourth exemplary embodiment of the present invention. The normalization circuit according to the fourth exemplary embodiment of the present invention performs an operation based on an input clock signal.

Consider a block composed of eight data, input data 1 to input data 8, shown below as an example of a block to be normalized, as in the third exemplary embodiment. Each input data is eight bits. In the following, the value of each data is represented by two's complement.

Input data 1: 00010111
Input data 2: 00110001
Input data 3: 00000110
Input data 4: 11110011
Input data 5: 11111000
Input data 6: 00000110
Input data 7: 00001011
Input data 8: 00011011

FIG. 11 shows an operation in the cycle 1' to the cycle 2' after the maximum exponent calculator 150 calculates the maximum exponent of input data in the cycle 1 to the cycle 2 shown in FIG. 8. The illustration of the operation of the cycle 1 is omitted because it is the same as shown in FIG. 8. Further, the cycle 3 and the cycle 1' are the same operation cycle.

Each of the four memories 120 stores input data while the maximum exponent calculator 150 calculates the maximum exponent of the input data in the cycles 1 to 2. After the maximum exponent calculator 150 completes the calculation of the maximum exponent, each of the four memories 120 sequentially outputs the stored input data to the shift circuit 130 in the cycles 1' to 2'. The memory 120 identifies the timing when the maximum exponent calculator 150 completes the calculation of the maximum exponent by referring to the block end signal.

The maximum exponent calculator 150 calculates the maximum exponent of the input data, which are input in groups of four per cycle, in the cycles 1 to 2. Next, the maximum exponent calculator 150 outputs −1 as the calculated maximum exponent to the shift circuit 130 in the cycle 3. The maximum exponent calculator 150 continues to output the maximum exponent −1 until the cycle 2' where the memory 120 completes the output of the stored input data.

In the cycles 1' to 3', the four shift circuits 130 perform normalization by sequentially shifting the input data 1 to 8 which are output from the memory 120, in groups of four per cycle, based on the maximum exponent −1 which is calculated and output by the maximum exponent calculator 150. Then, the shift circuits 130 output data obtained by normalizing the input data 1 to 8 as normalized data 1 to 8.

As a result, the normalized data 1 to 8 which are output from the shift circuits 130 are as follows, and the normalization ends correctly. Data after normalization of the input data k is referred to as the normalized data k (k is a positive integer of any one of 1 to 8.).
Normalized data 1: 00101110
Normalized data 2: 01100010
Normalized data 3: 00001100
Normalized data 4: 11100110
Normalized data 5: 11110000
Normalized data 6: 00001100
Normalized data 7: 00010110
Normalized data 8: 00110110

[Advantageous Effect of Fourth Exemplary Embodiment]

According to the fourth exemplary embodiment, because the maximum exponent calculator 150 according to the third exemplary embodiment is used for the calculation of the maximum exponent with a large processing volume in the normalization of a block floating point, it is possible to reduce the circuit scale and power consumption required for the calculation of the maximum exponent. Further, the normalization circuit according to the fourth exemplary embodiment includes the maximum exponent calculator 150 that can calculate the maximum exponent at high speed and allow reduction of the circuit scale and power consumption. Then, the normalization circuit executes the normalization of a block floating point based on the maximum exponent that is calculated by the maximum exponent calculator 150. As a result, according to the fourth exemplary embodiment, it is possible to execute the normalization of a block floating point at high speed and reduce the circuit scale and power consumption.

Further, because the block floating point normalization circuit according to the fourth exemplary embodiment includes four memories 120 and four shift circuits 130 and further includes the maximum exponent calculator 150 that calculates the maximum exponent in parallel of four, it is possible to execute the maximum exponent calculation and the normalization of a block floating point in parallel of four. As a result, there is a feature that it can execute the normalization of a block floating point at high speed.

Figure 12:
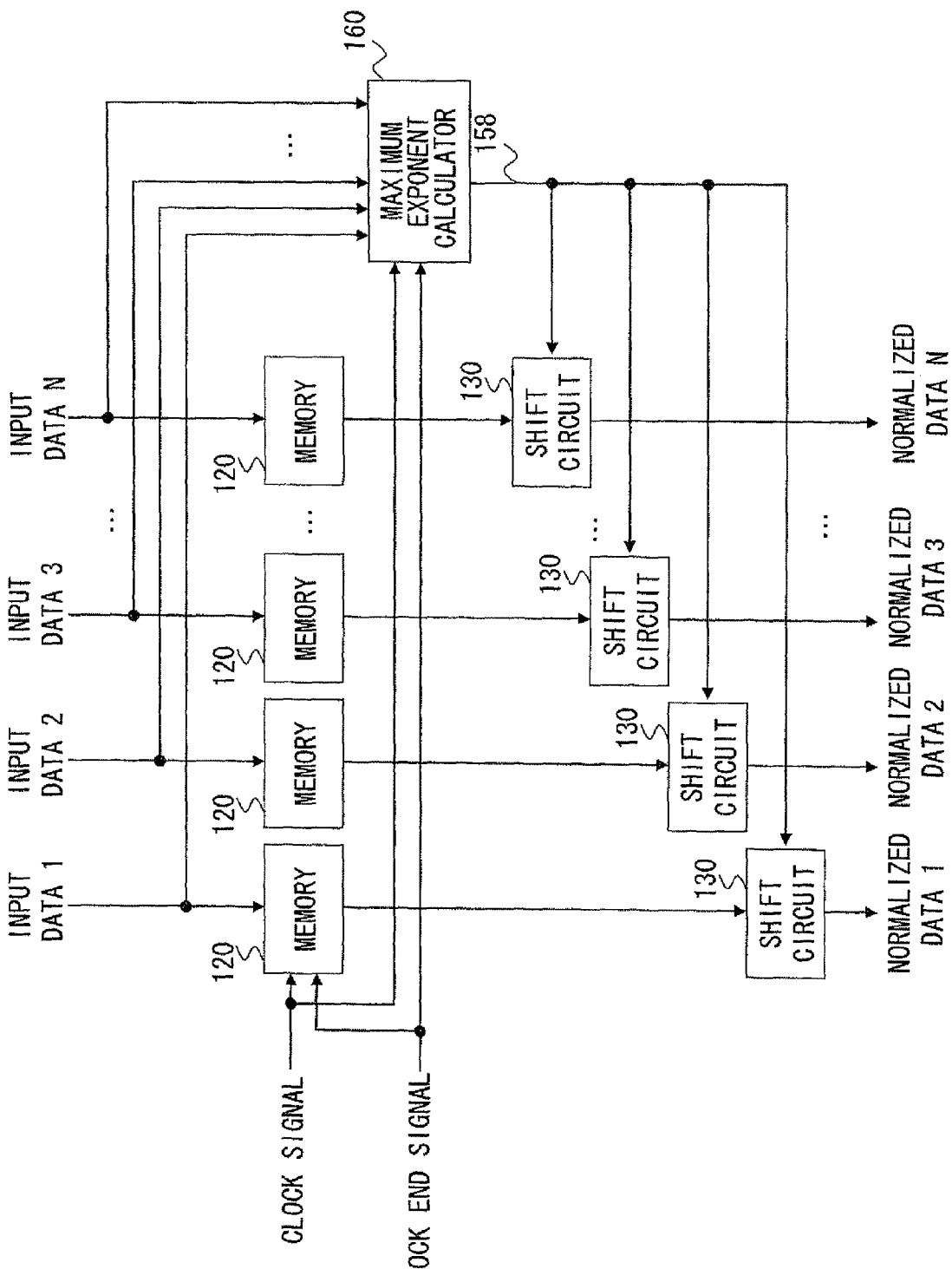
FIG. 12 is a block diagram showing another configuration example of a normalization circuit according to the fourth exemplary embodiment of the present invention.

Although the case of executing the normalization in parallel of four is described in the fourth exemplary embodiment, the number of parallelism may be arbitrary. For example, FIG. 12 shows a configuration example of a block floating point normalization circuit that includes N number of memories 120 and four shift circuits 130 and further includes the maximum exponent calculator 160 that calculates the maximum exponent in parallel of N and thereby executes the normalization in parallel of N (N is an integer of 2 or above).

Note that the present invention is not limited to the above-described exemplary embodiments, and various changes may be made without departing from the scope of the invention.

Although the edge detector generates a bit string in which a value indicating that the values of adjacent bits are different (the transition value) is 1 and a value indicating that the values of adjacent bits are not different (the non-transition value) is 0 for a bit string that constitutes input data in the exemplary embodiment, it is not limited thereto. The edge detector may generate a bit string in which a value indicating that the values of adjacent bits are different is 0 and a value indicating that the values of adjacent bits are not different is 1. In other words, the edge detector may include an XNOR circuit rather than an XOR circuit, for example. In this case, an AND circuit that calculates the logical AND of data output from the edge detector, is included instead of an OR circuit, for example. Then, the MSB-side bit position detector calculates the maximum exponent based on the bit position where the bit value is 0 of the AND value output from the AND circuit.

Although the XOR result of a pair of the n-th bit and the (n+1)th bit from the MSB of the bit string that constitutes input data is set as the n-th bit from the MSB (n is an integer of 0 or above) in the bit string generated by the edge detector and the OR circuit in the exemplary embodiment, it is not limited thereto. For example, when the bit string of input data is eight bits, the edge detector and the OR circuit may set the XOR result of a pair of the n-th bit and the (n+1)th bit from the MSB of the bit string that constitutes the input data as the (7-n)th bit from the MSB. Stated differently, the edge detector and the OR circuit may set the XOR result of a pair of the n-th bit and the (n+1)th bit from the MSB of the bit string that constitutes the input data as the n-th bit from the LSB. In this case, a bit position detector that calculates −1×L as the maximum exponent from the LSB side when the position where the bit value is 1 of the OR value output from the register is the L-th bit from the LSB (L is an integer of 0 or above) is included instead of the MSB-side bit position detector, for example. Note that the 0th bit from the LSB is the LSB.

Although the logical OR of the bit string which is generated by the edge detector is calculated and the maximum exponent is calculated based on the calculated OR value in the exemplary embodiment, it is not limited thereto. For example, the bit string generated by the edge detector may be directly output to the MSB-side bit position detector sequentially, without including the OR circuit and the register. In this case, the MSB-side bit position detector calculates the exponent for each of the bit strings which are sequentially output from the edge detector. Then, the MSB-side bit position detector may determine the exponent having the greatest value among all data in the block as the maximum exponent. It is thereby possible to calculate the maximum exponent at high speed compared with the case of calculating the exponent for each of calculated absolute values and determining the exponent having the greatest value among all data in the block as the maximum exponent.

This application is based upon and claims the benefit of priority from Japanese patent application No. 2010-141765 filed on Jun. 22, 2010 the disclosure of which is incorporated herein in its entirety by reference.

REFERENCE SIGNS LIST

50 SEMICONDUCTOR INTEGRATED CIRCUIT
51 BIT STRING GENERATOR
52 EXPONENT CALCULATOR
100 MAXIMUM EXPONENT CALCULATOR
101 EDGE DETECTOR
102 OR CIRCUIT
103 REGISTER
104 MSB-SIDE BIT POSITION DETECTOR
105 EDGE DETECTION RESULT
106 OR VALUE
107 REGISTER VALUE
110 EXCLUSIVE OR CIRCUIT
120 MEMORY
130 SHIFT CIRCUIT
150 MAXIMUM EXPONENT CALCULATOR
152 OR CIRCUIT
160 MAXIMUM EXPONENT CALCULATOR
162 OR CIRCUIT

The invention claimed is:

1. A semiconductor integrated circuit that, when normalizing a plurality of block floating point data included in a block by a common exponent, calculates the exponent of the plurality of data, comprising:
    a bit string storage unit;
    a plurality of bit string generators that generate a second bit string containing bits having a transition value indicating that values of adjacent bits are different or a non-transition value indicating that values of adjacent bits are not different for each pair of adjacent bits of a first bit string constituting the data, in each operation cycle;
    a bit string composer that, based on a plurality of second bit strings corresponding to the number of the plurality of bit string generators generated by the plurality of bit string generators, generates a third bit string in which, when a bit in the same position is the transition value in at least one of the plurality of second bit strings, a bit corresponding to the position has a first value, and, when a bit in the same position is the non-transition value in all of the plurality of second bit strings, a bit corresponding to the position has a second value, and stores the third bit string into the bit string storage unit, in each operation cycle; and
    a bit position detector that calculates the exponent of the plurality of data based on a bit position of the first value in the third bit string stored in the bit string storage unit, wherein
    when the third bit string is stored in the bit string storage unit, the bit string composer generates the third bit string in which, when a bit in the same position is the transition value in at least one of the plurality of second bit strings and the third bit string, a bit corresponding to the position has the first value, and, when a bit in the same position is the non-transition value in all of the plurality of second bit strings and the third bit string, a bit corresponding to the position has the second value, and updates the third bit string stored in the bit string storage unit to the generated third bit string,
    the bit position detector calculates the exponent according to an input of a block end signal indicating the last operation cycle in the block, and
    the bit string storage unit deletes the third bit string stored in the bit string storage unit according to the input of the block end signal indicating the last operation cycle in the block.

2. The semiconductor integrated circuit according to claim 1, wherein
    in the second bit string, a bit corresponding to a pair of n-th (n is an integer of 0 or above) bit and (n+1)th bit from a most significant bit of the first bit string is set as n-th bit from the most significant bit,
    in the third bit string, a bit corresponding to n-th bit from the most significant bit of the second bit string is set as n-th bit from the most significant bit, and
    the bit position detector calculates the exponent based on the bit position of the first value from the most significant bit in the third bit string.

3. The semiconductor integrated circuit according to claim 1, wherein the bit string composer generates a logical OR of the plurality of second bit strings or a logical OR of the plurality of second bit strings and the third bit string, as the third bit string.

4. The semiconductor integrated circuit according to claim 3, wherein the bit string generator generates a second bit string containing bits indicating an exclusive OR of adjacent bits contained in the first bit string constituting the data.

5. The semiconductor integrated circuit according to claim 1, further comprising:
    a shift circuit that normalizes the data by shifting the first bit string based on the exponent calculated by the bit position detector.

6. The semiconductor integrated circuit according to claim 5, wherein
    the semiconductor integrated circuit includes a plurality of shift circuits, and
    the plurality of shift circuits normalize the plurality of data in groups of the number of the plurality of shift circuits each.

7. The semiconductor integrated circuit according to claim 6, further comprising:
    a memory that stores the data until the exponent is calculated, and, after calculation of the exponent is completed, outputs the stored data to the shift circuit.

8. The semiconductor integrated circuit according to claim 7, wherein the memory outputs the stored data to the shift circuit according to the input of the block end signal indicating the last operation cycle in the block.

9. The semiconductor integrated circuit according to claim 1, wherein
    the bit position detector calculates the maximum exponent in the block.

10. An exponent calculation method that, when normalizing a plurality of block floating point data included in a block by a common exponent, calculates the exponent of the plurality of data in a semiconductor integrated circuit, comprising:
    generating, in a second bit generator, second bit strings containing bits having a transition value indicating that values of adjacent bits are different or a non-transition value indicating that values of adjacent bits are not different for each pair of adjacent bits of a first bit string, generated in a first bit string generator, constituting the data, in groups of a predetermined number of second bit strings each, in each operation cycle;
    generating, in a third bit generator, a third bit string in which, when a bit in the same position is the transition value in at least one of the plurality of second bit strings, a bit corresponding to the position has a first value, and, when a bit in the same position is the non-transition value in all of the plurality of second bit strings, a bit corresponding to the position has a second value based on the generated predetermined number of second bit strings, and storing the third bit string into a bit string storage unit, in each operation cycle;

calculating, in a bit position detector, the exponent of the plurality of data based on a bit position of the first value in the third bit string stored in the bit string storage unit according to an input of an block end signal indicating the last operation cycle in the block, and deleting the third bit string stored in the bit string storage unit; and in the generation of the third bit string, when the third bit string is stored in the bit string storage unit, generating the third bit string in which, when a bit in the same position is the transition value in at least one of the plurality of second bit strings and the third bit string, a bit corresponding to the position has the first value, and, when a bit in the same position is the non-transition value in all of the plurality of second bit strings and the third bit string, a bit corresponding to the position has the second value, and updating the third bit string stored in the bit string storage unit to the generated third bit string.

11. A semiconductor integrated circuit that, when normalizing a plurality of block floating point data included in a block by a common exponent, calculates the exponent of the plurality of data, comprising:

bit string storage means;

a plurality of bit string generators that generate a second bit string containing bits having a transition value indicating that values of adjacent bits are different or a non-transition value indicating that values of adjacent bits are not different for each pair of adjacent bits of a first bit string constituting the data, in each operation cycle;

a bit string composer that, based on a plurality of second bit strings corresponding to the number of the plurality of bit string generators generated by the plurality of bit string generators, generates a third bit string in which, when a bit in the same position is the transition value in at least one of the plurality of second bit strings, a bit corresponding to the position has a first value, and, when a bit in the same position is the non-transition value in all of the plurality of second bit strings, a bit corresponding to the position has a second value, and stores the third bit string into the bit string storage means, in each operation cycle; and a bit position detector that calculates the exponent of the plurality of data based on a bit position of the first value in the third bit string stored in the bit string storage means, wherein when the third bit string is stored in the bit string storage means, the bit string composer generates the third bit string in which, when a bit in the same position is the transition value in at least one of the plurality of second bit strings and the third bit string, a bit corresponding to the position has the first value, and, when a bit in the same position is the non-transition value in all of the plurality of second bit strings and the third bit string, a bit corresponding to the position has the second value, and updates the third bit string stored in the bit string storage means to the generated third bit string, the bit position detector calculates the exponent according to an input of an block end signal indicating the last operation cycle in the block, and the bit string storage means deletes the third bit string stored in the bit string storage means according to the input of the block end signal indicating the last operation cycle in the block.

* * * * *